United States Patent [19]
Rostoker et al.

[11] Patent Number: 5,489,538
[45] Date of Patent: Feb. 6, 1996

[54] METHOD OF DIE BURN-IN

[75] Inventors: Michael D. Rostoker, San Jose; Conrad Dell'Oca, Palo Alto, both of Calif.

[73] Assignee: LSI Logic Corporation, Milpitas, Calif.

[21] Appl. No.: 370,565

[22] Filed: Jan. 9, 1995

Related U.S. Application Data

[63] Continuation of Ser. No. 933,325, Aug. 21, 1992, abandoned.

[51] Int. Cl.⁶ .......................... G01R 31/26; H01L 21/66
[52] U.S. Cl. .................. 437/8; 437/51; 437/226; 148/DIG. 162
[58] Field of Search .................. 148/DIG. 162; 437/51, 226

[56] References Cited

U.S. PATENT DOCUMENTS

| | | | |
|---|---|---|---|
| 3,984,860 | 10/1976 | Logue | 437/8 |
| 4,703,436 | 10/1987 | Varshney | 437/8 |
| 4,778,771 | 10/1988 | Hiki | 437/8 |
| 4,974,049 | 11/1990 | Sueda et al. | 257/204 |
| 5,047,711 | 9/1991 | Smith et al. | 437/8 |
| 5,103,557 | 4/1992 | Leedy | 437/8 |
| 5,219,765 | 6/1993 | Yoshida et al. | 437/8 |

FOREIGN PATENT DOCUMENTS 63-124443  5/1988  Japan ............ 437/8

*Primary Examiner*—Olik Chaudhuri
*Assistant Examiner*—H. Jey Tsai

[57] ABSTRACT

The present invention provides for a burn-in test which is conducted on the wafer level, before the dies are separated into individual chips and packaged. In a preferred embodiment of the invention, a series of chips are each connected to an external current, ground, and/or alternate signal source(s) for burn-in. Generally, the method herein for a burn-in of a semiconductor die comprises the step of: (a) providing an electrical connection between a die on a semiconductor wafer and an external current source; (b) heating the semiconductor wafer; and (c) applying a common signal across the electrical connection to burn in the die. A preferred method herein provides a semiconductor wafer including a multiplicity of dies and wafer level test points, at least one layer of conductive lines overlying the semiconductor wafer, a means for connecting an individual conductive line to a test point on the wafer; and a means for connecting the conductive lines to an external signal source for exercising the dies.

5 Claims, 8 Drawing Sheets

METHOD OF DIE BURN-IN

This application is a continuation of application Ser. No. 07/933,325, entitled "METHOD OF DIE BURN-IN", filed Aug. 21, 1992, and now abandoned.

TECHNICAL FIELD

This invention relates generally to the manufacture of semiconductor chips. More particularly, this invention relates to a method for improving the burn-in operation for semiconductor chips.

BACKGROUND OF THE INVENTION

A semiconductor wafer is a thin, usually round slice of a semiconductor material, from which chips are made. A semiconductor wafer is processed with deposition and etching steps to produce circuits. A die is a set of semiconductor circuits on a wafer separated by scribe lines. After all of the wafer fabrication steps are completed, dies are separated, usually by sawing. The separated die units are referred to as chips.

In practice, a wafer is fabricated using standard semiconductor fabrication techniques. A silicon wafer 10 including a multiplicity of dies 12 is shown in FIG. 1. After fabrication, the wafers are put through a die sort procedure. Each individual die is electrically tested for electrical performance and circuit functioning. During a die sort procedure, the wafer is mounted on a vacuum chuck and aligned to thin electrical probes that contact each of the bonding pads on the die. The probes are connected to power supplies that test the circuit and record the results. The number, sequence and type of tests are usually directed by a computer program. Specific die sort techniques are well known to the art.

Dies which do not pass the die sort are identified. As shown in FIG. 2, the silicon wafer 10 which has gone through die sort procedures includes "passed" dies 14, which are unmarked, and "failed" dies 16, which are commonly marked with an ink dot. Alternatively, a computer map of the wafer, indicating the status of the dies, can be produced. In prior art chipmaking processes, the wafer is then cut apart, and individual "passed" chips are packaged into semiconductor devices. The packaged semiconductor devices may then be re-tested, and may be burned-in prior to final test and shipment.

The last test for a packaged semiconductor chip can be a burn-in testing. Burn-in techniques are used to identify chips that, while passing tests initially, fail very early in their operational life. The burn-in process accelerates these early failures. Burn-in testing is used generally for many commercial devices, but is usually a required process in high-reliability device lots for life-support or military applications.

Burn-in testing of semiconductor chips conventionally takes place after packaging of the semiconductor chip is completed. Prior art tests require that each individual package be separately powered while it is heated. This is generally accomplished by insertion of the packaged chip or chip set into a board socket. The board and chip are then mounted in a chamber with temperature-cycling capability, and the chip is powered (for static burn-in) or powered and exercised (for dynamic burn-in).

Difficulty has arisen with standard burn-in methodologies when multi-chip packages are manufactured. When a multi-chip package fails during burn-in, the package is opened, the failed chip is removed, and a replacement chip is inserted. The entire package must then undergo a repeat burn-in procedure. The in-use failure rate for these repaired chip packages is greater than for those in which the chips are burned in without failure and subsequent chip replacement.

SUMMARY OF THE INVENTION

The present invention provides for a burn-in test which is conducted on the wafer level, before the dies are separated into individual chips and packaged. In a preferred embodiment of the invention, a series of chips are connected to an external current, ground, and/or other signal source for burn-in. The entire wafer is heated, and the dies are powered (for static burn-in processes) or powered and exercised (for dynamic burn-in processes).

Static burn-in procedures involve the heating of semiconductor circuitry, and the application of a current of a specific voltage across the circuitry. Generally, the method herein for a static burn-in of a semiconductor die comprises the step of: (a) providing an electrical connection between a die on a semiconductor wafer and an external electrical current source; (b) heating the semiconductor wafer; and (c) applying a current across the electrical connection to burn in the die. Preferably, a plurality of dies on the wafer are each connected to the external current source. The apparatus for this static burn-in procedure also preferably includes an electrical ground connected to the die or dies to be burned in.

Dynamic burn-in procedures involve the heating of semiconductor circuitry, and the exercising of the circuitry using one or more signal inputs. Generally, the method herein for a dynamic burn-in of a semiconductor die comprises the steps of: (a) providing an electrical connection between a die on a semiconductor wafer and an external input source; (b) heating the semiconductor wafer; and (c) applying a signal input across the electrical connection to burn in the die. Generally, for dynamic burn-in, a variety of signal inputs are introduced to semiconductor die circuitry in a serial data stream. Signal inputs can include one or more current input, clock input, test data input, and/or test mode select input. Test data output signals can be used to determine the functioning of the circuitry, if desired. Preferably, a plurality of dies on the wafer are simultaneously connected to each signal I/O source. The apparatus for this dynamic burn-in procedure also preferably includes an electrical ground means connected to the die or dies to be burned in.

Preferably, the semiconductor die includes BIST (Built In Self Test) apparatus, which tests the die with only a clock stimulus from the tester. Alternatively, it is possible to use external memory and scan testing, which converts serial data input to a simulated parallel data input format. In the preferred embodiment, the die includes circuitry which conforms to IEEE Standard 1149.1 protocols, although other boundary-scan and serial-data communication protocols can also be used.

A preferred method for burn-in of one or more electrical die on a semiconductor wafer includes the steps of: (a) performing a preliminary die sort test to select a die without apparent flaws; (b) connecting the die selected in step (a) to a signal source; (c) using the signal to burn in the die; and (d) determining the performance of the burned-in die.

BRIEF DESCRIPTION OF THE DRAWINGS

FIG. 3b is a top view of a portion of a semiconductor chip 12 which has been cut from a wafer 10 of FIG. 3a.

FIG. 5b is a top view of a portion of a semiconductor chip 13 which has been cut from a wafer 10 of FIG. 5a.

FIG. 6b is a top view of a portion of a semiconductor chip 13 which has been cut from a wafer 10 of FIG. 6a.

DISCLOSURE OF THE INVENTION INCLUDING BEST MODE

Dies can be burned in using static burn-in procedures. Static burn-in involves heating the semiconductor wafer for a specified period of time, and applying an electrical current to the individual dies of the wafer during the heat cycle.

Figure 3A:
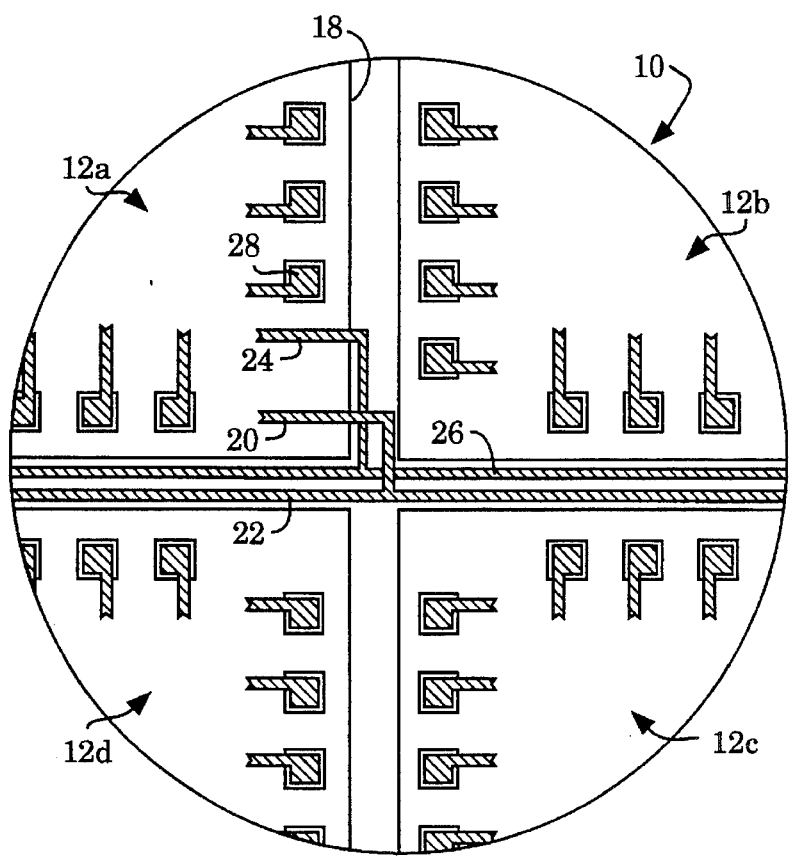
FIG. 3a is an enlarged view of a portion of a semiconductor wafer 10, showing the corners of four dies, which may be "passed" dies 14, and the positioning of die attach pads 28 along the edge of the dies. Electrical traces 22, 26 which connect the individual dies 12 to external circuitry for static burn-in is present in the scribe line between the die boundaries 18.

A current source having a predetermined voltage is electrically connected to each die to be burned in. FIG. 3a shows an enlarged section of a semiconductor wafer 10 which includes embedded electrical traces for die burn-in. The intersection of four individual dies 12a–d is shown. Located between the die boundaries 18 of adjoining dies are discrete wafer traces 22, 26 which are used for wafer-level die burn-in, and which are removed during the wafer saw process when individual semiconductor chips are produced.

The pictured semiconductor die has been designed to include an electrical trace for electrical current access 20 during wafer-level die burn-in. A current access 20 permits the connection of the semiconductor circuitry within the die (not shown) to an external current source (not shown). The electrical connection between the circuitry contained within an individual die and the external current source is provided by an electrical trace 22 which extends from each die to two contact points on the wafer (not shown) to which the external current source is connected to form a complete circuit.

Similarly, the pictured die includes a ground access 24. A ground access 24 permits the connection of the semiconductor circuitry within the die (not shown) to an external electrical ground (not shown). The electrical connection between the circuitry contained within the die and the external ground is provided by an electrically conductive ground trace 26 which extends from each die to two contact points on the wafer (not shown) to which the external ground is connected.

If a die is failed and removed from further processing, it may be desirable to sever electrical connections between the die and any external input. For example, the electrical current access 20 can be severed from the electrical trace 22. Similarly, the ground access 24 can be severed from the ground trace 26. Methods for disconnecting the specific dies from the common electrical traces include mechanical or laser cutting. Such methods are well known to the art.

Figure 3B:
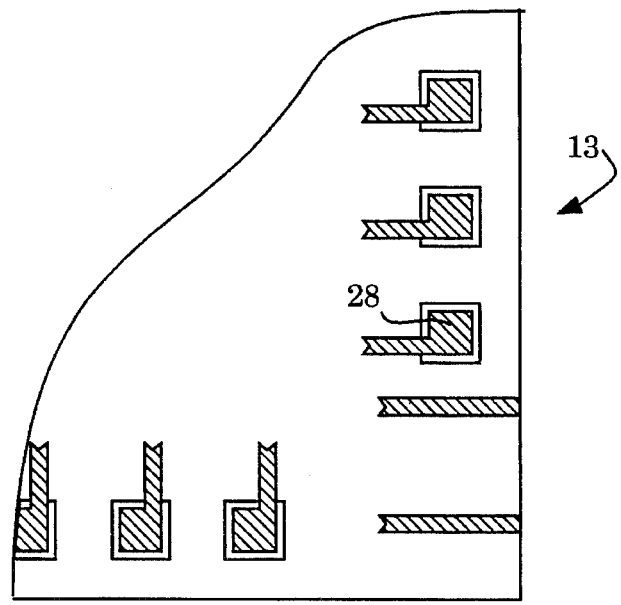

In the embodiment shown in FIG. 3a, the wafer traces 22, 26 are made as part of the wafer fabrication, and are included as part of the overall design of the wafer. The electrical trace 22 and ground trace 26 are positioned in the scribe lines between the die boundaries 18. Die attach pads 28 are present along the edges of each die 12. These die attach pads 28 may be input, output, ground, or other signal contact pads which are normally found on the periphery of an integrated circuit die. Alternatively, one or more die attach pads 28 may be specifically added to tile die for purposes of the present invention. When the dies are separated into chips during the wafer saw process, the traces are removed. A corner of a semiconductor chip 13 is shown in FIG. 3b. The die attach pads 28 are not affected by the wafer saw, and remain available for further testing or for the connection of electrical leads.

Another embodiment, which includes "flying wires" which are attached to the die or dies for the purpose of wafer-level burn-in, are described with reference to dynamic burn-in procedures and FIGS. 4–7. An embodiment in which overlying electrical or signal traces are formed above the dies 12 is pictured in FIGS. 8–10. Any of embedded trace, flying wire, or overlying trace methodologies can be used for either wafer-level static or dynamic burn-in of dies.

During a static burn-in, tile die is simultaneously exposed to an electrical current and to an elevated temperature. The specific voltage applied to the wafer for the burn-in process will vary with the die circuit design and its ultimate environment of use. For example, a chip designed for use with a 5 V power source is commonly burned in using a 5.5 V power supply. Variations of such burn-in parameters are well known to those skilled in the art in view of the specific circuitry on the wafer.

The wafer is subjected to a heating cycle contemporaneously with the application of an electrical current through its circuits. The specific temperature and time range for the heating cycle are based upon the specific design and use of the completed semiconductor chip. Wafers undergoing die burn-in will be subjected to heating and voltage parameters such as those currently used for the burn-in of individual semiconductor chips. For example, the wafer can be heated to a temperature of from less than 100° C. to 165° C. or more. Usually, the wafer is heated to a temperature of from about 145° C. to about 155° C. If desired, the temperature can be cycled between a higher temperature and a lower temperature for varying time periods. Time and temperature burn-in parameters are well known to those skilled in the art, and can be varied by known processes in view of the specific circuitry present on the wafer.

If a dynamic burn-in is desired, the wafer is heated and the circuits are exercised by the application of appropriate signals. For example, clock input signals, data or other current input signals, and/or ground input signals can be applied to the die. A variety of appropriate exercise routines are well known to those skilled in the art.

The specific inputs used to exercise the die will be circuit-dependent and will vary with the ultimate use of the chip. However, it is generally preferred that the number of required die attachments for testing be minimized. The use of BIST (Built In Self Test) apparatus and methods are known to the art. In such protocols, a serial input stream is fed into a testing apparatus internal to the die, which takes the serial data stream and simulates a parallel stream of data within the die. The data stream can be routed to any desired I/O port, to simulate an input at that port, if provision is made for this in the die design. Similarly, the BIST circuitry can be used to generate test data from power-up conditions if desired.

A variety of such test protocols are known to the art. In a preferred embodiment of this invention, the testing protocols conform to the signal input parameters set forth by the IEEE Standard 1149.1. For purposes of example only, and not by way of limitation, the dynamic burn-in methods and apparatus will be described in conjunction with data input which conforms to IEEE Standard 1149.1. It will be understood that a smaller or greater number of pins can be used for dynamic burn-in using alternate testing protocols.

A method for burning in an electrical die on a semiconductor wafer generally comprises the steps of: (a) performing a preliminary die sort test to select a die without apparent flaws; (b) connecting the die selected in step (a) to an external signal source; (c) using the signal to burn in the die; and (d) determining the performance of the burned-in die.

Figure 1:
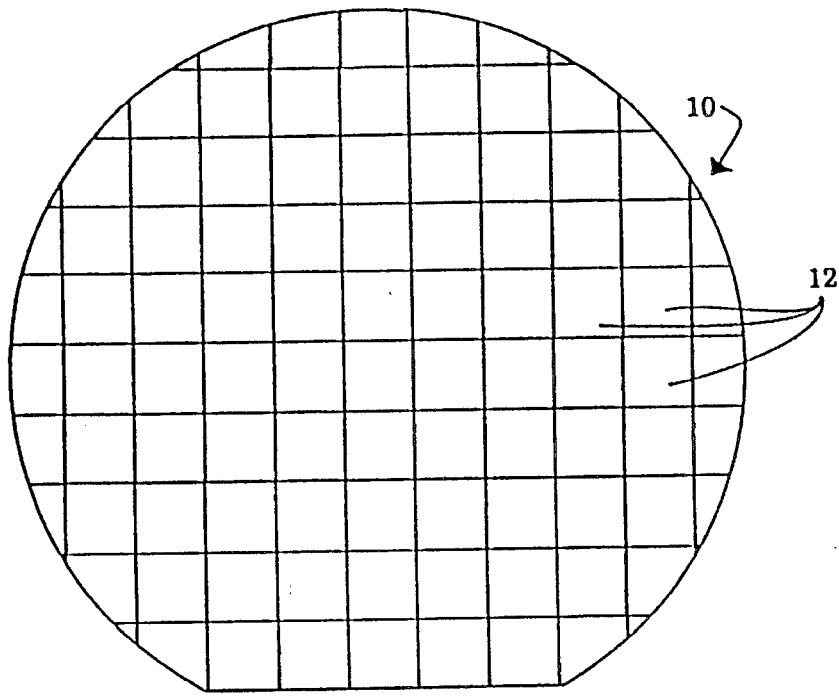
FIG. 1 a top view of a semiconductor water 10 including a multiplicity of dies 12.
Figure 2:
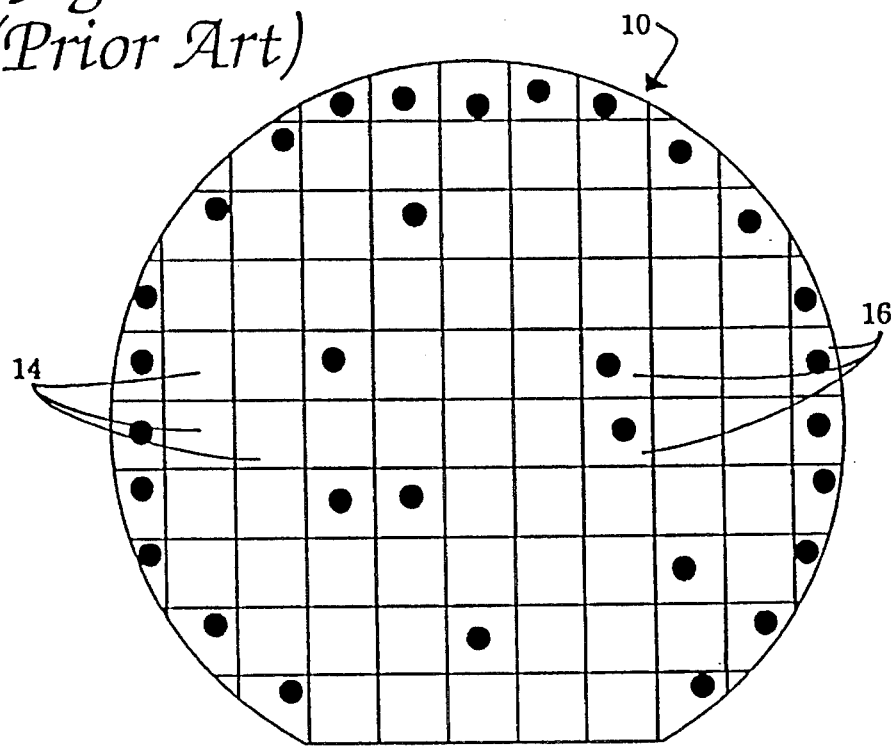
FIG. 2 a top view of a semiconductor wafer 10 including a multiplicity of dies 14, 16 which have been marked after die sort procedures.

In the preliminary die sort, each individual die is electrically tested for electrical performance and circuit functioning. Generally, a visual inspection is performed first, and any dies which show gross abnormalities or failure to comply with standards are removed from further processing. The wafer is then aligned to an array of electrical probes that contact specific bonding pads on the die. The probes are connected to power supplies that test the circuit and record the results. Dies which exhibit shorts or other electrical failures are noted for removal from further processing. As described with reference to FIG. 2, "passed" dies commonly remain unmarked, while "failed" dies are marked with an ink dot. Alternatively, a computer map of the wafer, indicating the status of each die, can be produced.

The wafers which have undergone a preliminary die sort are connected to a multiplicity of external signal sources, in compliance with IEEE Standard 1149.1 input parameters. Preferably, an electrical current source and a ground source are also supplied at each die.

Figure 4:
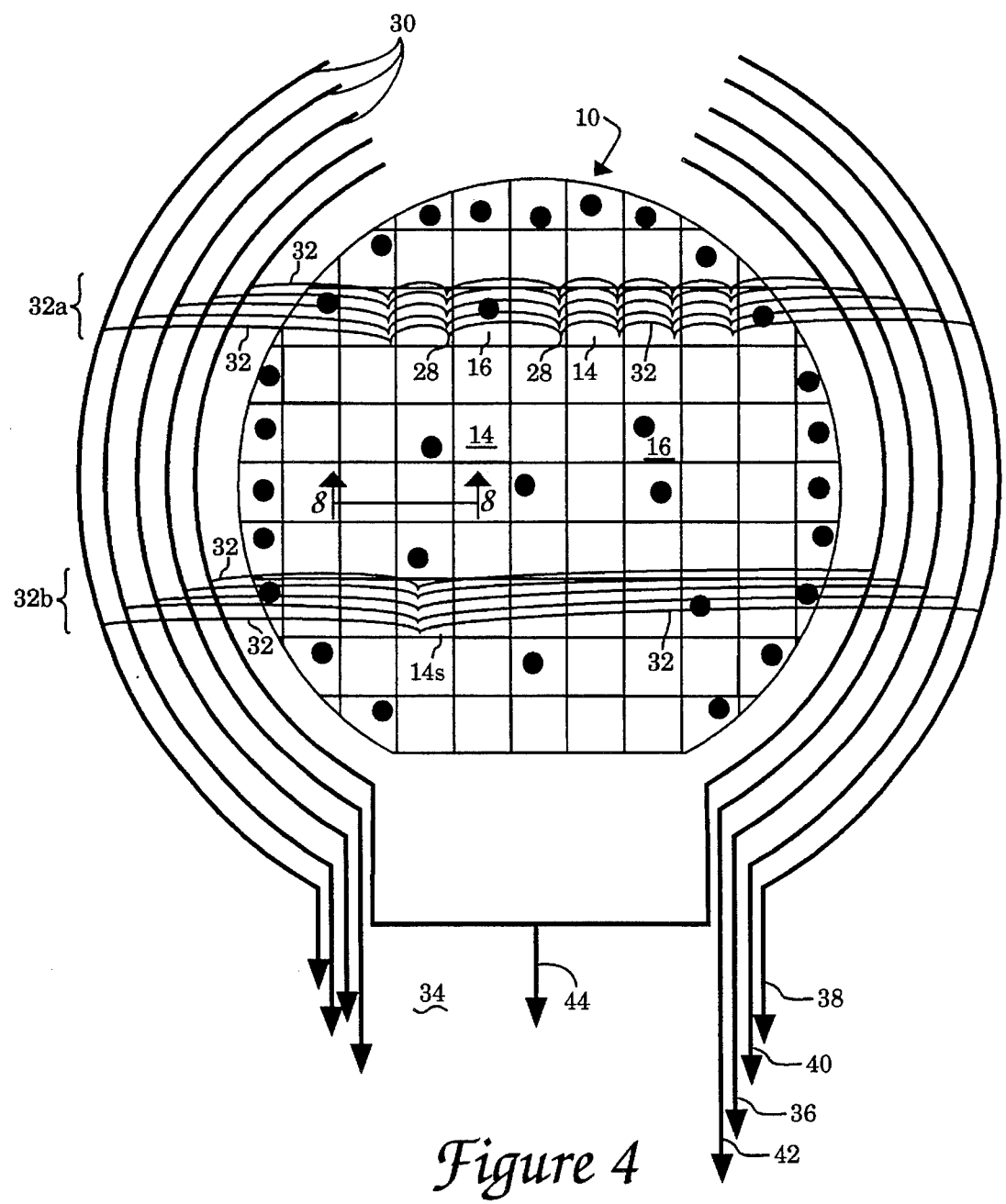
FIG. 4 is a top view of a semiconductor wafer 10 in position for dynamic burn-in of selected dies in accordance with a preferred embodiment of this invention.

One embodiment for such connections is shown in FIG. 4. The semiconductor wafer 10 is placed so that it can be easily connected to a series of lead traces 30. The lead traces 30 are generally made of a conductive material which is easily bonded using manual or automated bonding procedures. The lead traces 30 form an incomplete circuit in the absence of a connector wire 32. For convenience, the lead traces 30 can be secured to a PC board or other structural support 34.

For purposes of clarity, one horizontal set of connector wires 32a is shown connecting a horizontal set of those dies 14 which passed the first die sort procedure to the lead traces 30. A second set of connector wires 32b is shown connecting a single die 14s to the lead traces 30.

When connector wires 32 are used to attach lead traces 30 to dies on a wafer in order to burn in the dies, those dies 16 which failed the first die sort procedure are generally not connected to the lead traces 30. Those dies 14 which passed the first die sort procedure can be connected individually 32b, or can be connected in a series 32a.

Individual dies 14 which have passed die sort are bonded, at discrete die attach pads 28, to each of the lead traces 30 using discrete connector wires 32. Any appropriate electrically conductive material can be used to electrically connect a die attach pad 28 to the lead trace 30. For example, the connector can be made of aluminum, copper, nickel, silver, gold, alloys thereof, electrically conductive doped polymers, and the like. Generally, a connector wire 32 is used. Wire of any desired diameter can be used. In a preferred embodiment, the connector wire 32 is an aluminum wire having a 3-mil diameter. The connector wire 32 is bonded to the designated die attach pad 28 using conventional bonding processes such as manual or automated bonding.

The lead traces 30 shown in FIG. 4 are those preferred for use when the die burn-in complies with the input parameters of IEEE Standard 1149.1. The physical layout and order of the lead traces 30 is not critical as long as functionality is not impaired.

A complete testing apparatus in compliance with IEEE Standard 1149.1 includes a TAP (Test Access Port) comprising a minimum of three input connections and one output connection. An optional fourth input connection provides for asynchronous initialization of the test logic. At a minimum, the TAP must include a test clock input (TCK), a test mode select input (TMS), and a test data input (TDI), along with a test data output (TDO). An optional test reset input (TRST) provides for asynchronous initialization of the TAP controller. Where the TAP controller is not reset at power-up as a result of features built in to the test logic, a TRST input is required. The complete testing apparatus is not necessary for the exercising of circuitry during dynamic burn-in processes, but may be used if desired.

A dynamic burn-in requires only IEEE Standard 1149.1 input protocols, and does not require that the output data from a specific die be monitored. The lead traces provide electrical connections to a test clock input (TCK connection 36), a test mode select input (TMS connection 38), and a test data input (TDI connection 40). An electrical current input having a specific voltage (VDD connection 42) and an electrical ground or voltage steady state (VSS connection 44) facilitate the burn-in process.

Each of the inputs has its own specific function. The TCK connection 36 provides the clock for the test logic within the die. Stored-state devices contained in the test logic must retain their state indefinitely when the signal applied to the TCK connection 36 is stopped at 0. The TMS connection 38 signal is decoded by the TAP controller to control test operations. Since the TCK connection 36 and TMS connection 38 provide signals for many components which may be controlled from a single driver, care should be taken to ensure that the load presented by the TCK connection 36 and the TMS connection 38 are each as small as possible.

The TDI connection 40 supplies serial test instructions and data to the test logic. The TDI connection 40 provides for serial movement of test data through the circuit. Values presented at the TDI connection 40 are clocked into the selected register (instruction or test data) on a rising edge of TCK.

The current input (VDD connection 42) provides an electrical current at a suitable voltage for the burn-in of the die. Generally, the die is burned in using a voltage greater than that under which it will normally be operating. The specific voltage applied to the wafer for the burn-in process will vary with the die circuit design and its ultimate environment of use. For example, a chip designed for use with a 5 V power source is commonly burned in using a 5.5 V power supply.

The VSS connection 44 provides an electrical ground, or a voltage steady state, to the die being burned in. Variations of voltage and ground burn-in parameters are well known to those skilled in the art, and can be varied in view of the specific circuitry on the die being burned in.

The sequence of operations is controlled by a bus master (not shown), which can be automatic test equipment, or a component which interfaces to a higher-level test bus as a part of a complete system maintenance architecture. In a burn-in environment, it can also be a stand-alone circuit built for this specific purpose and incorporated into the burn-in hardware. Control is achieved through signals applied to the Test Mode Select (TMS) and Test Clock (TCK) inputs of the various components connected to the bus master. Starting from an initial state in which the test circuitry defined by the IEEE Standard 1149.1 is inactive, a typical sequence of operations is as follows:

The instruction code for the particular operation to be performed is serially loaded into the component. The test logic defined by the IEEE Standard 1149.1 is designed such that the serial movement of instruction information is not apparent to those circuit blocks whose operation is controlled by the instruction. The instructions applied to these blocks change only on completion of the shifting (instruction load) process.

Once the instructions have been loaded, the selected test circuitry is configured to respond. It may be necessary to load data into the selected test circuitry before a meaningful response can be made. If so, data is loaded into the component serially in a manner analogous to the process used previously to load the instruction. The movement of test data has no effect on the instructions present in the test circuitry.

Following execution of the test instructions, based where necessary on data supplied, the results of the test can be examined by shifting data out of the component to or through a bus master if such data output is desired.

In cases where the same test operation is to be repeated, but with different data, new test data can be shifted into the component while the test results are shifted out. There is generally no need for the instruction to be reloaded.

Operation of the test circuitry can proceed by loading and executing several further instructions in a manner similar to that described, to exercise the die. The concluding step of the testing process is to return the test circuitry to its initial state.

A die attach pad 28 to which a connector wire 32 is bonded can be located at any point on the surface of, or in association with, a semiconductor die 12. In a standard die 12, a multiplicity of die attach pads 28 can be located at the periphery of the die, along one, two, three or four edges, as shown in FIG. 5. An alternate embodiment, in which certain die attach pads 28 are located between the die boundaries 18, is shown in FIG. 6. Usually, the die attach pads 28 are located along two or four edges of a rectangle or square.

Generally, the die attach pads 28 used for die burn-in are sacrificial pads. They are used for the purpose of die burn-in, and then are not reused for any purpose. A multiplicity of die attach pads are present for alternate functions, such as testing in a second die sort or other function tests, connection to chip electrical leads, and the like. As shown in partial view in FIG. 5a, a multiplicity of die attach pads 28 are located along each edge of a square die 12a–d. Electrically conductive internal traces 46 extend between the die attach pads 28 and the semiconductor circuitry (not shown).

Each lead trace 30 is generally connected to at least one die attach pad 28 on each die within the circuit. When five lead traces are connected to each die, providing five different input or outputs, such as current, ground or other signal inputs or outputs, at least five separate die attach pads 28 must be used on each die. In the pictured embodiment, a connector wire 32 is bonded to the die attach pad 28 using any conventional bonding process, such as manual or automated bonding.

Figure 5A:
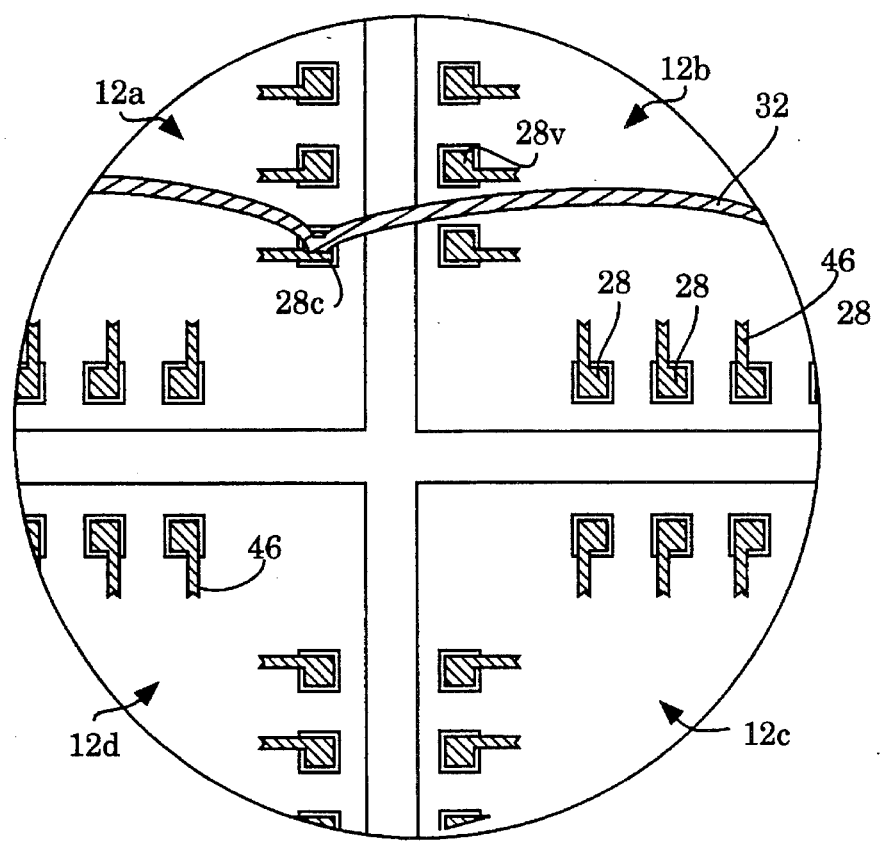
FIG. 5a is an enlarged view of a portion of a semiconductor wafer 10, showing the corners of four dies 12. Die attach pads 28 are positioned along the edge of each die 12.
Figure 5B:
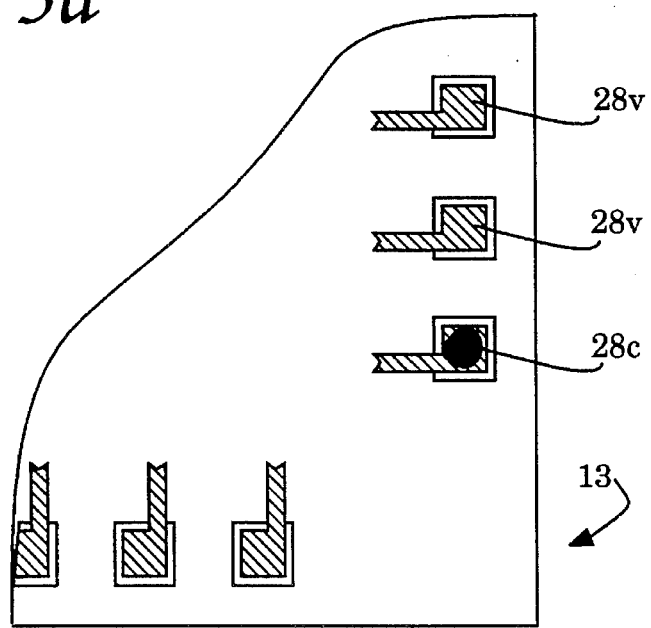

FIG. 5b shows a corner of a chip 13, such as those dies shown in FIG. 5a, after die burn-in, removal of the connector wire 32, and die saw. Those die attach pads 28v which were not used to attach a connector wire 32 are suitable for use in the further processing of the chip. The pictured die attach pad 28c was used to attach a connector wire 32 and is not suitable for further use.

Figure 6A:
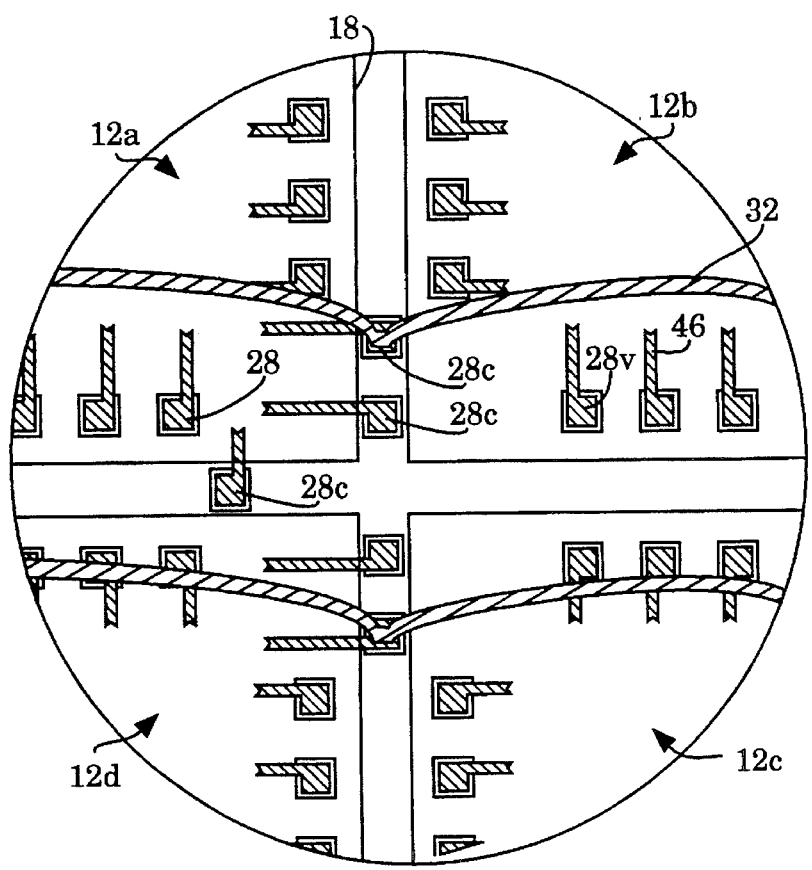
FIG. 6a is an enlarged view of a portion of a semiconductor wafer 10, showing the corners of four dies 12. Die attach pads 28 are present along the edge of the dies, and in the scribe lines between the die boundaries 18 of adjoining dies 12.
Figure 6B:
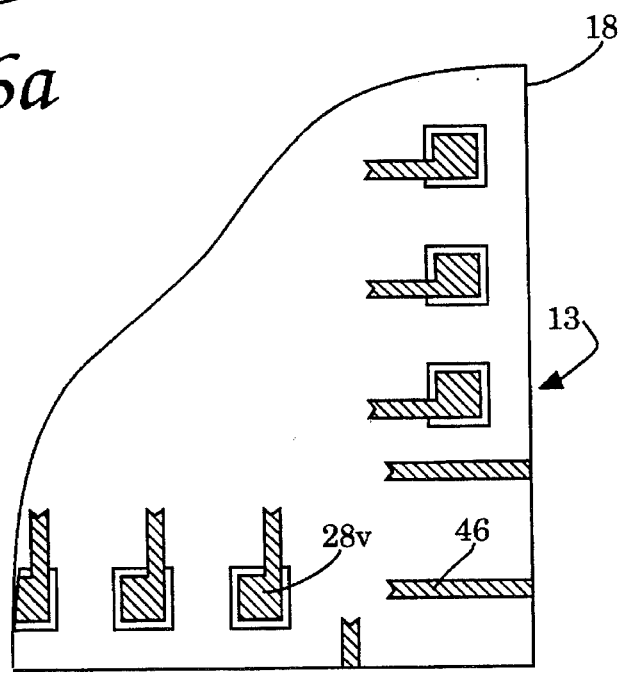

FIG. 6 shows an alternate layout for die attach pads. As shown in FIG. 6a, a multiplicity of die attach pads 28v are located along each edge of a square die. Those die attach pads 28c to which a connector wire is or will be bonded are located between the die boundaries 18. As shown in FIG. 6b, when the die is separated into chips 13, the sacrificial die attach pads 28c are physically removed, and only the electrically conductive internal traces 46 which had extended between the die attach pads (no longer present) and the semiconductor circuitry (not shown) remains. Those die attach pads 28v which were not used to attach a connector wire 32 are suitable for use in the further processing of the chip.

Figure 7:
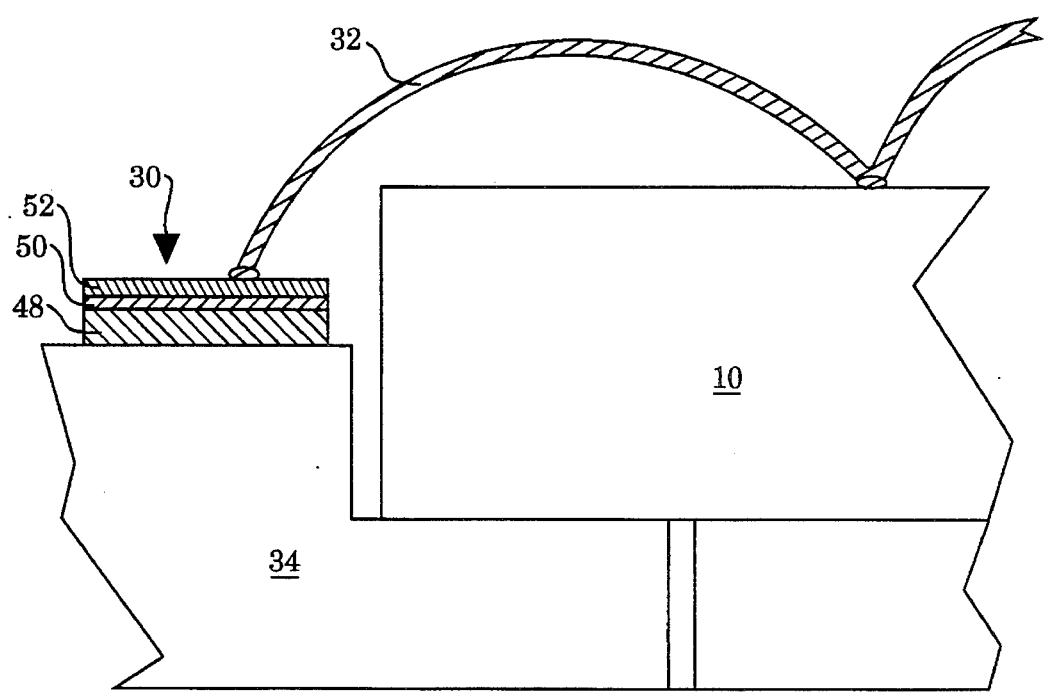
FIG. 7 is a partial cross-sectional view of a semiconductor wafer 10 electrically attached to the lead trace 30 by a connector wire 32.

FIG. 7 shows a partial side view of a semiconductor wafer 10, a support structure 34, a lead trace 30, and a connector wire 32. Preferably, the lead trace 30 is a sturdy conductive material which is easily bonded using manual or automated bonding procedures, and which preferably will withstand numerous bonding procedures. For example, the trace can be made of aluminum, copper, nickel, silver, gold, alloys thereof, electrically conductive doped polymers, and the like. In one especially preferred embodiment, the lead traces 30 exhibit a layered structure. The lower layer 48 is made of copper, especially of copper having a thickness of approximately 25 microns. An intermediate layer 50 is made of nickel, and can have a thickness of, for example, approximately 0.1 micron. An upper layer 52 is made of gold, and can have a thickness of, for example, about 0.05 micron. In this preferred embodiment, the trace 30 has a width of about 100 mils.

When individual dies on the wafer have been suitably connected to the external traces used to provide power, ground, and signals, the entire wafer is heated, and the dies are exercised in a standard manner to provide dynamic burn-in.

The specific temperature and time range for the heating cycle are based upon the specific design and use of the completed semiconductor chip. Wafers undergoing die burn-in will be subjected to heating and voltage parameters such as those currently used for the burn-in of individual semiconductor chips. For example, the wafer can be heated to a temperature of from less than 100° C. to 165° C. or more. Usually, the wafer is heated to a temperature of from about 145° C. to about 155° C. If desired, the temperature can be cycled between a higher temperature and a lower temperature for varying time periods. Time and temperature burn-in parameters are well known to those skilled in the art, and can be varied by known processes in view of the specific circuitry present on the wafer.

When the die burn-in is completed, the connector wires are removed from the die attach pads. The wafer is removed and can be tested in a second die sort. Each individual die is electrically re-tested using an array of electrical probes, to determine electrical performance and circuit functioning. As with the preliminary die sort, the wafer is aligned to an array of electrical probes that contact each of the bonding pads on the die. The probes are connected to power supplies that test the circuit and record the results. Dies which exhibit shorts or other electrical or electronic failures are noted for removal from further processing. Failed dies can be noted with an ink spot or by notation on a computer map of the wafer, as described above.

The wafer is then cut into its component die (also called "chips") in a die saw procedure. Chips which have failed either the first die sort or the second die sort are discarded. Those chips which have passed the first die sort, undergone the burn-in procedures, and have passed the second die sort undergo further processing, such as integration into single-chip or multi-chip packages.

The PC board or other structural support on which the wafer and lead traces have been held during the die burn-in is preferably cleaned using any appropriate method, and readied for re-use.

In the embodiments described above, lead traces 30 are used to provide signals from external signal sources (not shown), through connector wires 32, to die attach pads 28 located either on the die 12 or within the boundaries of adjacent scribe lines 18. As noted, the lead traces 30 are external to the wafer 10, and are suitably supported by a PC board or other structural support 34.

Connecting discrete wires (e.g., connector wires 32) directly to bond pads 28 on the die 12, and then disconnecting them at or before the time individual dies 32 are separated from the wafer 10 may cause damage to semiconductor devices contained on the dies 12. Similarly, connecting wires (e.g., connector wires 32) to bond pads 28 within the scribe lines 18 adjacent to the dies 12 may cause damage to the dies 12. In either case, there are disadvantages inherent in connecting (e.g., by bonding), and then disconnecting, wires to and from a semiconductor wafer 10, especially after the die 12 has been tested.

Figure 8:
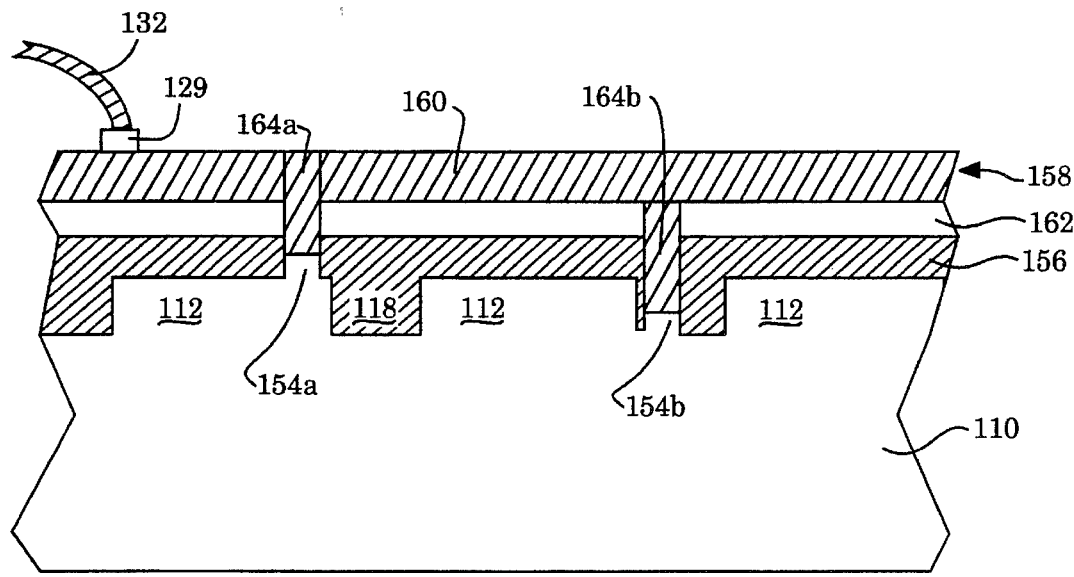
FIG. 8 is a cross-sectional view of a portion of a semiconductor wafer 110 taken through line 8—8 of FIG. 4. Conductive lines 160 which are used to connect individual dies 112 to external circuitry for burn-in is present in one or more layers above the dies 112. Conductive vias 164 provide electrical connection between individual dies 112 and the conductive lines 160 within a conductive layer 158.

FIG. 8 shows an alternate embodiment of the invention herein wherein wires (e.g., connector wires 132) to external signal sources (not shown) are connected to the wafer 110 through "test points" 154. The test points 154 are similar to bond pads 28, in that they are either directly on (154a) or adjacent to (154b) a die 112, but they need not be so large as to accommodate bonding of connector wires 132, as wires are not bonded the test points 154.

A semiconductor wafer 110 is processed to have a plurality of semiconductor dies 112, separated by scribe lines 118, disposed on a surface. A covering layer 156 is shown, which may be a passivation layer, or any other suitable "final" layer involved in the fabrication of the semiconductor devices, such as it top metal, or the like. A "substantially fully processed" semiconductor wafer 110 includes a covering layer 156 which covers a plurality of semiconductor dies 112, each die having a die boundary 118 defining scribe lines.

Early on in the wafer fabrication process (prior to completing substantially fully processing the wafer) test points 154 are arranged either on a die 154a, or in a scribe line adjacent to a die 154b, as discussed above with respect to die pads 28. For purposes of the embodiments shown in FIGS. 8 through 10, it is relatively immaterial exactly where the test points are located (e.g., on, or adjacent to, a die), as long as they are electrically associated with the dies.

In this embodiment of the invention, at least one overlying first conductive layer 158 of first conductive lines 160 is formed atop the wafer, insulated (if necessary) by an insulating layer 162 (e.g., an oxide layer) from the covering layer 156 of the substantially fully processed wafer.

Conductive vias 164 are filled with an electrically conductive material, and provide electrical connection between two elements. Conductive vias 164a are formed between selected first conductive lines 160 of the first conductive layer 158 and corresponding selected test points 154a on the wafer. Additional conductive vias 164b are formed between selected other conductive lines (not visible)of the first conductive layer 158 and corresponding selected other test points 154b on the wafer. In the pictured embodiment, a first conductive via 164a connects to a test point 154a on a die 112, while a second conductive via 164b connects to a test point 154b adjoining a die 112. This is for purposes of illustration: test points 154 on a specific wafer can be restricted to only test point 154a on a die 112, to only test points 154b adjoining a die 112, or can include a combination of such test points 154.

At a common location on the wafer, such as at one edge of the wafer, bond pads 129 are provided, generally corresponding on a one-to-one basis to the first conductive lines 160 of the first conductive layer 158. An external signal source (not shown) is connected to these bond pads 129 with connector wires 132, similar to the connector wires 32 (above). In an alternate embodiment (not shown), mechanical probes can be urged against the first conductive lines 160 of the first conductive layer 158 themselves, or to probe pads 129 on the lines.

After burn-in, or any other procedure involving providing signals from external sources into the dies, the conductive layer 158 may be left on the wafer (and consequently positioned over the individual dies) as a grounded electromagnetic (EM) shield, or may be removed by etching or polishing. One suitable technique for removing the conductive layer 158 is chemi-mechanical polishing, as described in U.S. Pat. Nos. 4,671,851, 4,910,155 and 4,944,836, the disclosure of each of which being incorporated herein by reference.

Figure 9:
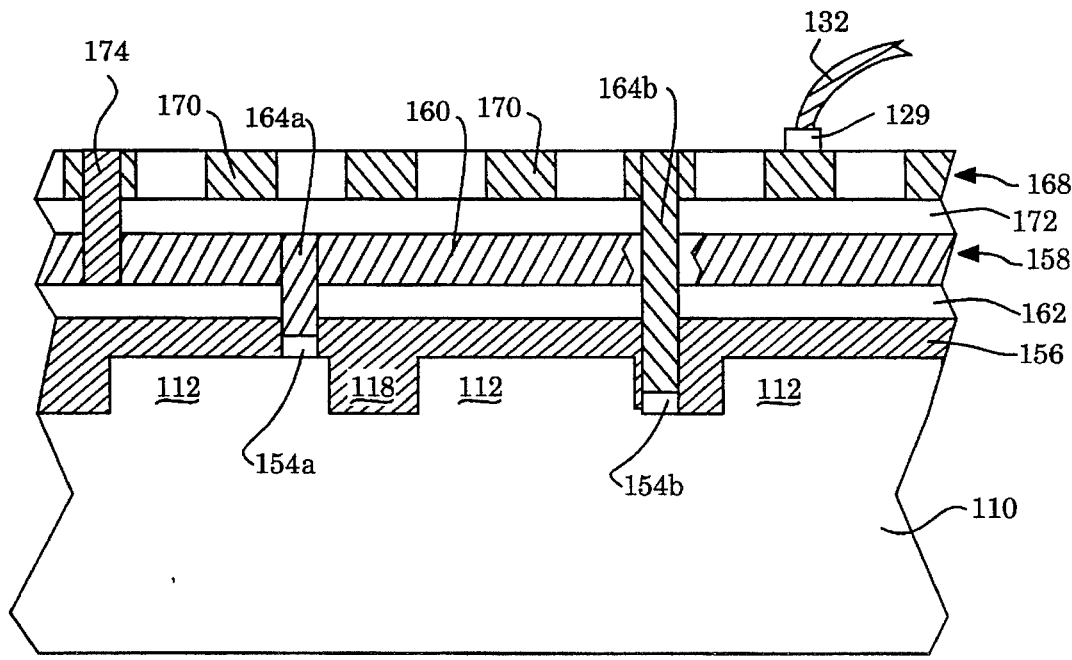
FIG. 9 is an alternate cross-sectional view of a portion of a semiconductor wafer 110. A plurality of conductive lines 160, 170 which are used to connect individual dies 112 to external circuitry for burn-in are present in layers above the dies 112. Conductive vias 164 provide electrical connection between individual dies 112 and individual conductive lines 160, 170 within the conductive layers 158, 168.

For more complex interconnection of signals from external sources to the dies, by way of overlying metal lines, it is possible to provide two or more conductive layers 158. One such embodiment is shown in FIG. 9: a second overlying layer 168 comprised of second conductive lines 170 (similar to the first conductive lines 160 of the first conductive layer 158) is provided over the first conductive layer 158, and is electrically separated therefrom by a suitable insulting layer 172. Conductive vias 164 are formed to electrically connect selected second conductive lines 170 to selected test points 154. As in the previous example, bond pads 129 are provided for connecting wires 132 from the second conductive lines 170 to external signal sources. Bond pads 129 and connector wires 132 to the first conductive lines 160 of the first conductive layer 158 are not shown in this Figure, for purposes of clarity.

The first conductive lines 160 are generally provided along a different, preferably orthogonal, axis to the second conductive lines 170. In this manner, the first conductive layer 158 and the second conductive layer 168 form a metal grid of conductive lines overlying the wafer and, consequently, overlying the individual dies.

In some situations, it may be necessary to effect complex routing of the signals on the first and second conductive lines 160 and 170, irrespective of whether the) originate from external sources (not shown, discussed above) or from the dies 112 themselves.

When complex routing of signals originating from external sources is necessary, it may be desirable to provide a particular signal from a particular conductor (e.g., one of a first or second conductive line 160 or 170) to a group of dies, such as all of the dies aligned along a row or column on the wafer.

When complex routing of signals emanates from the dies themselves, the dies are exercised, and probed to determine signal levels and/or logic states associated with individual circuit elements on the dies. Alternatively, Input/Output (I/O) points associated with the dies can be interconnected by means of conductive lines overlying the covering layer 156, to form a multi-chip module (MCM) of two or more interconnected dies on a wafer. (In this case, the dies forming the MCM need not be singulated from the semiconductor wafer. Rather, the chips will remain together on the wafer or a portion thereof. Scribe lines for separating the interconnected dies are not necessary.)

FIG. 9 also shows a means for interconnecting the first conductive lines 160 of the first conductive layer 158 to the second conductive lines 170 of the second conductive layer 168 by means of grid vias 174. Grid vias 174 are vias which are filled with a conductive material, and provide electrical connection between two conductive layer 158 and 168, and especially between two conductive lines 160 and 170 between two conductive layer 158 and 168. This method is applicable to situations wherein complex routing of signals is required, whether the signals originate from external sources or from the dies 112 themselves. Unlike the conductive vias 164, the conductive grid vias 174 extend between a first conductive line 160 of the first conductive layer 158 to a second conductive line 170 of the second conductive layer 168, and do not necessarily extend to wafer level.

In the embodiment shown in FIG. 9, a first conductive via 164a extends between a conductive line 160 of the first conductive layer 158 to an "I/O" point 166a (structurally equivalent to a "test point" 154a) on the die to provide signals from the first conductive layer 158 to and from the die. A second conductive via 164b extends between a conductive line 170 of the second conductive layer 168 to an "I/O" point 166b, (structurally equivalent to a "test point" 154b) adjacent to the die, to provide signals from the second conductive layer 168 to and from the die. Grid vias 174 extend between a conductive line 160 of the first conductive layer 158 to a conductive line 170 of the second conductive layer 168.

Figure 10:
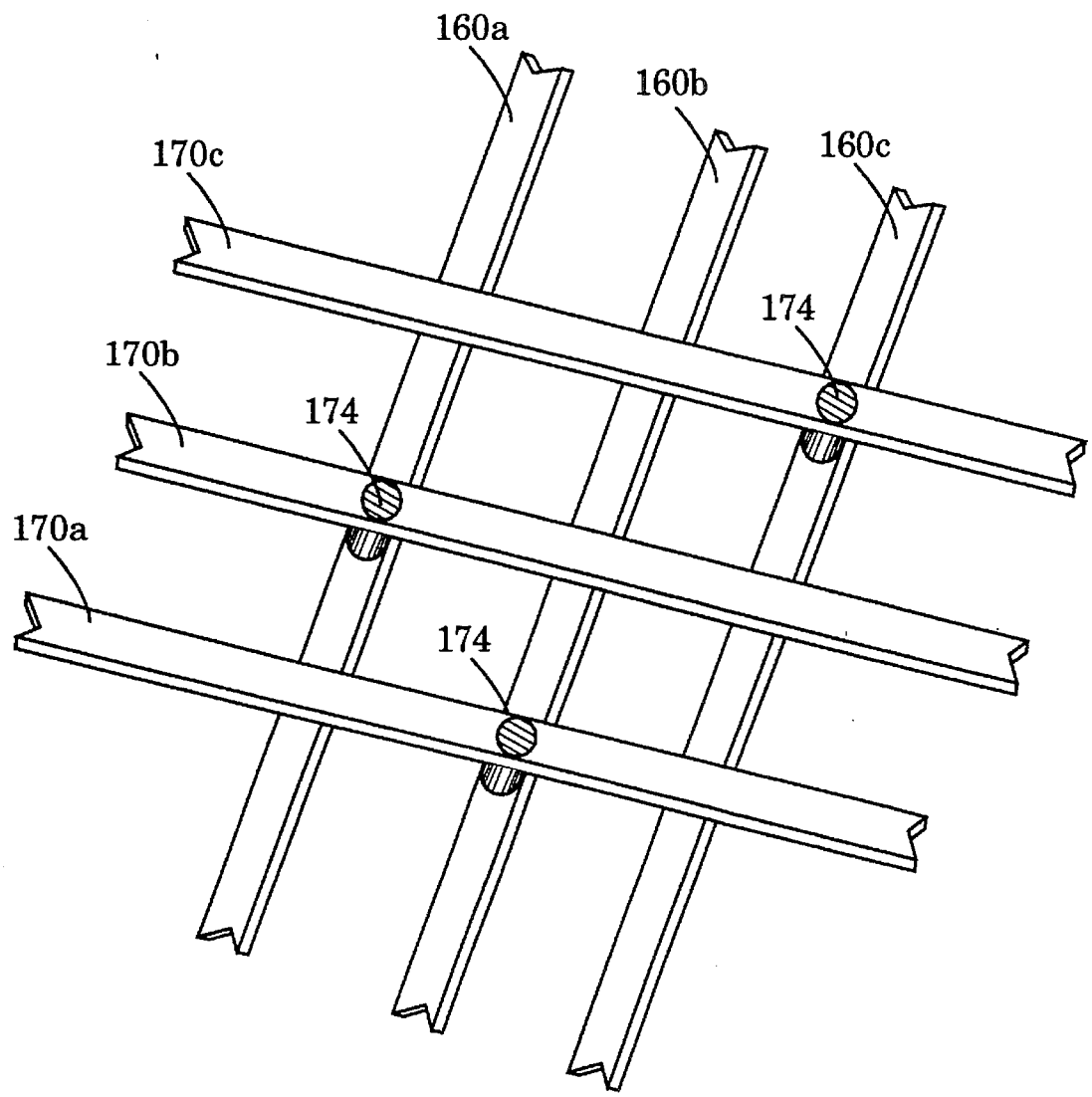
FIG. 10 shows a pattern of conductive lines and grid vias.

FIG. 10 shows the use of grid vias 174 to connect three separate conductive lines 160a, 160b, and 160c of the first conductive layer 158 to three separate conductive lines 170b, 170a, and 170c, respectively, of the second conductive layer 168.

The type of interconnections shown in FIGS. 9 and 10 are useful for exercising the dies, such as by using "cross-check" methodology. U.S. Pat. Nos. 4,749,947, 4,937,826 and 4,975,640 are incorporated by reference herein, as examples of "cross-check" methodology. This type of configuration is also useful for creating a multi-chip module (MCM) of interconnected dies on a wafer. Such interconnected dies can be all the same size and have the same function, or they can be of different sizes and have different functionality (such as microprocessor and random access memory). In either case, the object is to interconnect the dies on the wafer, without singulating the dies from one another.

If one or more of the first conductive layer 158 or the second conductive layer 168 is no longer required (e.g., after cross-check testing) it is possible to polish or etch off the first conductive layer 158 and/or the second conductive layer 168 layers of conductive lines.

Alternatively, the overlying conductive lines can be used both for exercising (including cross-check testing), and for interconnecting the dies (e.g., in an MCM). In such a case, it is possible that the dies would need to be "re-wired", or re-interconnected, after exercising reveals faulty dies. In such a case, redundant "back-up" dies can be provided, and may be dynamically wired to other dies simply by polishing off or otherwise removing the overlying layers of conductive lines, and redepositing these layers in a new configuration to interconnect the "good" dies and avoid interconnecting any faulty dies.

Grid vias 166 can be used to electrically connect a conductive line 160 of the first conductive layer 158 to a conductive line 170 of the second conductive layer 168, so that electrical connections from the die to the first conductive layer 158 can be made through the topmost layers of the wafer. These electrical connections can easily be severed by etching at a later point.

While the invention has been described in connection with several exemplary embodiments, it will be understood that many modifications will be apparent to those of ordinary skill in the art in light of the above disclosure. Such modifications may include using substitute materials, smaller or greater dimensions, different types of integrated circuit devices, a variety of different shapes for the dies, different testing protocols, and so forth, to achieve substantially the same results in substantially the same way. Reference to the following claims should be made to determine the scope of the claimed invention.

We claim:

1. Method of burning-in and harvesting a plurality of functional dice from a semiconductor wafer, comprising the steps of:

providing a plurality of sets of bond pads on a semiconductor wafer characterized by a plurality of semiconductor dice, each of the plurality of sets of bond pads associated with corresponding ones of the dice;

depositing an insulating layer on the wafer;

depositing a plurality of conductive lines on the insulating layer for connecting together selected ones of the plurality of sets of bond pads;

connecting an external source of power and test signals to the plurality, of conductive lines, thereby applying the power and test signals contemporaneously to the selected ones of the plurality of sets of bond pads;

identifying defective ones of the plurality of semiconductor dice;

removing the plurality of conductive lines and insulating layer from the wafer; and separating the semiconductor wafer into individual dice for packaging into integrated circuits.

2. The method of claim 1, wherein the step of depositing an insulating layer comprises the steps of depositing a plurality of insulating layers.

3. The method of claim 2, wherein the steps of depositing a plurality of insulating layers includes the steps of depositing different ones of the plurality of conductive lines between the plurality of insulating layers so as to make multilevel connections to different ones of the selected ones of the plurality of sets of bond pads.

4. The method of claim 1, wherein the step of removing is by etching the wafer.

5. The method of claim 1, wherein the step of removing is by polish grinding the wafer.

* * * * *